United States Patent
Oyamada et al.

(10) Patent No.: US 10,950,571 B2
(45) Date of Patent: Mar. 16, 2021

(54) BONDING WIRE FOR SEMICONDUCTOR DEVICE

(71) Applicants: NIPPON STEEL CHEMICAL & MATERIAL CO., LTD., Tokyo (JP); NIPPON MICROMETAL CORPORATION, Saitama (JP)

(72) Inventors: Tetsuya Oyamada, Tokyo (JP); Tomohiro Uno, Tokyo (JP); Takashi Yamada, Saitama (JP); Daizo Oda, Saitama (JP); Motoki Eto, Saitama (JP)

(73) Assignees: NIPPON STEEL CHEMICAL & MATERIAL CO., LTD., Tokyo (JP); NIPPON MICROMETAL CORPORATION, Saitama (JP)

( * ) Notice: Subject to any disclaimer, the term of this patent is extended or adjusted under 35 U.S.C. 154(b) by 0 days.

(21) Appl. No.: 16/313,825

(22) PCT Filed: Feb. 14, 2018

(86) PCT No.: PCT/JP2018/005091
§ 371 (c)(1),
(2) Date: Dec. 27, 2018

(87) PCT Pub. No.: WO2018/155283
PCT Pub. Date: Aug. 30, 2018

(65) Prior Publication Data
US 2019/0326246 A1    Oct. 24, 2019

(30) Foreign Application Priority Data
Feb. 22, 2017    (JP) .............................. JP2017-031517

(51) Int. Cl.
*H01L 23/00* (2006.01)
*C22C 9/00* (2006.01)
*C22F 1/08* (2006.01)

(52) U.S. Cl.
CPC ................ *H01L 24/45* (2013.01); *C22C 9/00* (2013.01); *C22F 1/08* (2013.01); *H01L 2224/45105* (2013.01); *H01L 2224/45109* (2013.01); *H01L 2224/45144* (2013.01); *H01L 2224/45147* (2013.01); *H01L 2224/45155* (2013.01); *H01L 2224/45164* (2013.01); *H01L 2224/45169* (2013.01); *H01L 2924/0102* (2013.01); *H01L 2924/01005* (2013.01); *H01L 2924/01015* (2013.01); *H01L 2924/01028* (2013.01); *H01L 2924/01029* (2013.01); *H01L 2924/01031* (2013.01); *H01L 2924/01032* (2013.01); *H01L 2924/01046* (2013.01); *H01L 2924/01057* (2013.01); *H01L 2924/01058* (2013.01); *H01L 2924/01077* (2013.01); *H01L 2924/01078* (2013.01); *H01L 2924/01079* (2013.01)

(58) Field of Classification Search
None
See application file for complete search history.

(56) References Cited

U.S. PATENT DOCUMENTS

| | | |
|---|---|---|
| 2008/0061440 A1 | 3/2008 | Uno et al. |
| 2011/0011618 A1 | 1/2011 | Uno et al. |
| 2013/0140084 A1* | 6/2013 | Sarangapani .......... H01R 4/029 174/94 R |
| 2016/0111389 A1 | 4/2016 | Yamada et al. |
| 2017/0194280 A1 | 7/2017 | Oda et al. |
| 2017/0200689 A1* | 7/2017 | Yamada .................... C22C 5/04 |
| 2017/0323864 A1 | 11/2017 | Oda et al. |

FOREIGN PATENT DOCUMENTS

| | | | |
|---|---|---|---|
| EP | 3121841 A1 | 1/2017 | |
| JP | S6120693 A | 1/1986 | |
| JP | H06168975 A | 6/1994 | |
| JP | H0770674 A | 3/1995 | |
| JP | 2008-85319 A | 4/2008 | |
| JP | 2008-85320 A | 4/2008 | |
| JP | 2010-171235 A | 8/2010 | |
| JP | 2016-164991 A | 9/2016 | |
| JP | 2017-005256 A | 1/2017 | |
| JP | 2017-38062 A | 2/2017 | |
| TW | 201643261 A | 12/2016 | |
| WO | 2015/152191 A1 | 10/2015 | |
| WO | WO-2016135993 A1 * | 9/2016 | ............. H01L 24/43 |
| WO | WO-2016203659 A1 * | 12/2016 | ............... C22C 9/04 |

(Continued)

OTHER PUBLICATIONS

Machine translation of JP S6120693A Translation from:https://www.j-platpat.inpit.go.jp/ translated on Oct. 6, 2020 (Year: 1986).*

International Search Report dated Apr. 11, 2018, issued in International Application No. PCT/JP2018/005091, including English translation.

Decision to Grant Patent dated Jun. 26, 2016, issued in Japanese Patent Application No. 2018-519887, including English translation.

Office Action issued in corresponding Korean Patent Application No. 10-2018-7037063, dated Jan. 13, 2019 with English machine translation.

(Continued)

*Primary Examiner* — David Sample
*Assistant Examiner* — Elizabeth Collister
(74) *Attorney, Agent, or Firm* — McDermott Will & Emery LLP

(57) ABSTRACT

The present invention provides a bonding wire for a semiconductor device suitable for cutting-edge high-density LSIs and on-vehicle LSIs by improving the formation rate of Cu—Al IMC in ball bonds. A bonding wire for a semiconductor device contains Pt of 0.1 mass % to 1.3 mass %, at least one dopant selected from a first dopant group consisting of In, Ga, and Ge, for a total of 0.05 mass % to 1.25 mass %, and a balance being made up of Cu and incidental impurities.

4 Claims, No Drawings

(56) References Cited

FOREIGN PATENT DOCUMENTS

WO  2017/221434 A1  12/2017
WO  2017/221770 A1  12/2017

OTHER PUBLICATIONS

Office Action dated Feb. 25, 2019, in corresponding Taiwanese Patent Application No. 107105956.
First Office Action issued in corresponding to Chinese Patent Application No. 201880002504.3, dated Sep. 4, 2019, with English translation.
First Office Action issued in corresponding to German Patent Application No. 112018000061.3, dated Sep. 20, 2019, with English translation.

* cited by examiner

BONDING WIRE FOR SEMICONDUCTOR DEVICE

CROSS REFERENCE

This application is the U.S. National Phase under 35 U.S.C. § 371 of International Application No. PCT/JP2018/005091, filed on Feb. 14, 2018, which claims the benefit of Japanese Application No. 2017-031517, filed on Feb. 22, 2017, the entire contents of each are hereby incorporated by reference.

TECHNICAL FIELD

The present invention relates to a bonding wire for a semiconductor device used to connect electrodes on semiconductor devices with wiring such as external leads of a circuit wiring board.

BACKGROUND ART

Currently, as bonding wires for a semiconductor device (hereinafter referred to as bonding wires) for use to bond electrodes on semiconductor elements with wiring such as external leads of a circuit wiring board, fine wires approximately 15 to 50 μm in wire diameter are mainly used. As a method for bonding the bonding wires to electrodes on a semiconductor device, a thermosonic bonding process is used commonly, and a general-purpose bonding machine, a capillary jig, and the like are used, where the capillary jig is used for connection by passing the bonding wire therethrough. A bonding wire bonding process involves heat-melting a wire tip by arc heat input, forming a ball (FAB: Free Air Ball) by surface tension, pressure-bonding the ball portion (hereinafter referred to as ball bonding) to an electrode of a semiconductor element heated in a range of 150 to 300° C., then forming a loop, and pressure-bonding a wire portion to an electrode on the side of the external lead (hereinafter referred to as wedge bonding) to complete the process. An electrode structure made up of an alloy film composed principally of Al and formed on a Si substrate is mainly used for the electrode on the semiconductor element to which the bonding wire is bonded while an electrode structure or the like plated with Ag or Pd is used for the electrode on the side of the external lead.

Gold (Au) and copper (Cu) are mainly used as bonding wire materials. Among others, Cu, which has the advantages of being higher in electric conductivity and lower in cost than Au, is used for various packages. Bonding wires made of Cu are roughly divided into: bonding wires having a coating layer of Pd, Au, or another element on the surface of Cu (hereinafter referred to as coated Cu wires); and bonding wires not having a coating layer (hereinafter referred to as bare Cu wires). Generally, in terms of performance, the coated Cu wires are superior to the bare Cu wires in many respects. This is because the coating layer improves oxidation resistance of the bonding wire surface, thereby improving ball formability and wedge bondability. On the other hand, in terms of price, the bare Cu wire is superior to the coated Cu wire. This is because there is no need to form a coating layer in a production process, which makes the bare Cu wire lower in production cost than the coated Cu wire. Recently, there has been growing demand for price reductions of bonding wires, and bare Cu wires have begun to attract attention.

For example, Patent Literature 1 discloses a bonding wire containing 0.001 wt % (inclusive) to 0.1 wt % (exclusive) of one or more elements selected from Sn, Zn, Zr, Ag, Cr, and Fe and 0.001 to 2 wt % of one or more elements selected from Mg, Ca, rare-earth elements, Ti, Hf, V, Nb, Ta, Ni, Pd, Pt, Au, Cd, B, In, Si, Ge, Pb, P, Sb, Bi, Se, and Te, with the balance being substantially made up of copper.

Also, Patent Literature 2 discloses a wire material containing 20 to 360 ppm of one or more elements selected from In, B, Bi, Ge, and Si; and 10 to 650 ppm of one or more elements selected from As, Zn, K, Sr, Mg, Ca, and Tl or 25 to 250 ppm of one or more elements selected from Sb, P, Li, Sn, Pb, and Cd; with the balance being made up of Cu.

Until now, large-diameter wires for power device applications have been in the mainstream of bare Cu wires. In recent years, along with enhancement in the functionality and accuracy of bonding machines used to bond bonding wires, the scope of application of bare Cu wires has been expanding. In particular, there are expectations for application of bare Cu wires to high-density LSIs in which a large number of wires are mounted and which can enjoy the benefits of cost reduction as well as to cutting-edge on-vehicle LSIs which have stringent performance requirements. Small-diameter wires are in the mainstream of bonding wires for such cutting-edge devices and bonding is done by forming balls smaller than usual (hereinafter referred to as small-ball bonding). The small-ball bonding presents a problem which is not encountered in usual ball bonding and which is expected to be dealt with in the development of bare Cu wires.

CITATION LIST

Patent Literature

Patent Literature 1: Japanese Patent Laid-Open No. 7-70674

Patent Literature 2: Japanese Patent Laid-Open No. 6-168975

SUMMARY OF INVENTION

Technical Problem

A new problem with the small-ball bonding is a low formation rate of Cu—Al intermetallic compound (Cu—Al IMC) formed in a bonding interface between a Cu bonding wire and Al alloy electrode in a ball bond. In the small-ball bonding, balls have large curvature, making it difficult to uniformly transmit energy of ultrasound or loads to a ball bonding interface and thereby resulting in a low formation rate of Cu—Al IMC. This leads to performance degradation such as a phenomenon in which a ball is separated from an Al electrode during ball bonding (hereinafter referred to as non-stick failure), a phenomenon in which a ball is separated when resin is poured to coat a semiconductor package (hereinafter referred to as ball separation), and a phenomenon in which bonding strength life (hereinafter referred to as long-term reliability) of a ball bond is reduced in a high-temperature environment.

Patent Literature 1 describes an effect on improvement in the bonding strength of ball bonds. Patent Literature 2 describes an improvement effect on separation of ball bonds in a heat cycle test. These techniques were considered to be effective for performance improvement in small-ball bonding, but sufficient improvement effect was not available when small-ball bonding was done. When the cause of the failure was analyzed, it was found in every case that regions where Cu—Al IMC was not formed served as starting points for cracks and separation, resulting in performance degradation. Also, even if the bonding strength of ball bonds were good, in the case of small-ball bonding, the bonding interface contained many regions where Cu—Al IMC was not formed, and the formation rate of Cu—Al IMC was low. In this way, performance deterioration in small-ball bonding was attributable to the low formation rate of Cu—Al IMC in ball bonds.

Thus, the present inventors considered that in order to apply the bare Cu wires to cutting-edge high-density LSIs and on-vehicle LSIs, a technique for improving the formation rate of Cu—Al IMC in ball bonds was needed.

In ball bonding, Cu and Al diffuse into each other in the interface between the Cu which is a material for balls and the Al alloy electrode, thereby causing Cu—Al IMC to grow. Therefore, in order to form Cu—Al IMC in the entire ball bond, it is important to make Cu and Al diffuse into each other in the entire ball bond. One of impediments to mutual diffusion of Cu and Al is an Al oxide existing on a surface of the Al alloy electrode. Diffusion of Cu and Al is significantly slow in the Al oxide, and so mutual diffusion of Cu and Al is inhibited in the region containing the Al oxide. In order for Cu—Al IMC to grow, it is important to expose a newly formed surface of Al by effectively destroying the Al oxide by the ultrasound and loads applied to the balls during ball bonding.

In order to effectively destroy the Al oxide during ball bonding, it is useful to increase hardness of the ball. However, if the ball hardness is too high, there arise problems of a defect called Al splashing in which the Al electrode deforms excessively and sweeps out around the ball bond and damage to a Si chip. Therefore, it is necessary to effectively destroy the Al oxide and maintain appropriate hardness to prevent Al splashing and Si chip damage. Also, depending on the types, concentrations, and combination of dopants, diffusion in the Cu—Al interface is inhibited, reducing the formation rate of Cu—Al IMC.

Thus, in order not to inhibit diffusion in the Cu—Al interface while achieving an improvement effect on increases in ball hardness, the present inventors attempted to optimize composition, including the types, concentrations, and combination, of dopants. In optimizing the composition, the present inventors took care to make sure that basic performance including ball formability and wedge bondability will not be degraded.

An object of the present invention is to provide a bonding wire for a semiconductor device suitable for cutting-edge high-density LSIs and on-vehicle LSIs by improving the formation rate of Cu—Al IMC in ball bonds.

Solution to Problem

After conducting studies in view of the above problem, the present inventors have found that the formation rate of Cu—Al IMC in ball bonds can be improved if an appropriate amount of at least one of In, Ga, and Ge is contained in Cu in addition to a predetermined amount of Pt, and thereby made the invention.

A bonding wire according to the present invention contains: Pt of 0.1 mass % to 1.3 mass %; at least one dopant selected from a first dopant group consisting of In, Ga, and Ge, for a total of 0.05 mass % to 1.25 mass %; and a balance being made up of Cu and incidental impurities.

Advantageous Effects of Invention

By containing Pt of 0.1 mass % to 1.3 mass % and at least one dopant selected from a first dopant group consisting of In, Ga, and Ge, for a total of 0.05 mass % to 1.25 mass %, the bonding wire according to the present invention can improve the formation rate of Cu—Al IMC in ball bonds.

DESCRIPTION OF EMBODIMENTS

A bonding wire of the present embodiment contains Pt of 0.1 mass % to 1.3 mass %, both inclusive, at least one dopant selected from a first dopant group consisting of In, Ga, and Ge, for a total of 0.05 mass % to 1.25 mass %, both inclusive, and a balance being made up of Cu and incidental impurities. The bonding wire of the present embodiment can improve the formation rate of Cu—Al IMC in ball bonds.

(About Formation Rate of Cu—Al IMC in Ball Bond)

The formation rate of Cu—Al IMC in a ball bond is defined herein as the ratio of the formation area of Cu—Al IMC to the bonding area of the ball bond. A method for measuring the bonding area of a ball bond and the formation area of Cu—Al IMC will be described. First, to prepare a specimen, ball bonds resulting from ball bonding of a bonding wire are heat-treated at 175° C. for 3 hours. This is done to facilitate the growth of Cu—Al IMC and thereby ease subsequent observation. Next, only the balls are dissolved by acid treatment, thereby exposing the Al electrodes and Cu—Al IMC. Subsequently, the Al electrodes are observed with the balls removed and the bonding area of each ball bond and the formation area of Cu—Al IMC are measured. The bonding area of the ball bond is the area of a region in which the Al electrode is deformed as a result of ball bonding. The formation area of Cu—Al IMC is the area of that region on the Al electrode in which Cu—Al IMC exists after the removal of the ball.

(Improvement Effect on Formation Rate of Cu—Al IMC)

The present inventors found that if 0.1 mass % to 1.3 mass % of Pt was contained and a total of 0.05 mass % to 1.25 mass % of at least one dopant selected from a first dopant group was contained, the formation rate of Cu—Al IMC in small-ball bonding was improved. Specifically, the use of the bonding wire according to the present embodiment was able to improve the formation rate of Cu—Al IMC in small-ball bonding to 80% or above. Also, no Al splashing or Si chip damage occurred. The hardness of the balls formed by the use of the bonding wire according to the present embodiment was measured with a Vickers hardness tester and microcompression tester and increases in the hardness were confirmed in the indications of both testers. A crystal structure of a ball section was revealed by etching and observed using an optical microscope and consequently, and it was confirmed that the crystal grains of the balls had been refined. It is considered that with the bonding wire of the present embodiment, by adding Pt compositely with at least one or more dopants selected from the first dopant group, a grain refinement effect was enhanced synergistically, increasing the hardness of the balls. Consequently, it is presumed that destruction of the Al oxide on the Al alloy electrodes was facilitated during ball bonding, improving the formation rate of Cu—Al IMC.

When the concentration of Pt is 0.3 mass % to 1.0 mass %, and a total of 0.05 mass % to 1.25 mass %, of at least one dopant selected from the first dopant group is contained or when 0.1 mass % to 1.3 mass %, of Pt is contained and the concentration of at least one dopant selected from the first dopant group is 0.10 mass % to 0.75 mass %, the formation rate of Cu—Al IMC is improved and this is preferable.

When the concentration of Pt is 0.3 mass % to 1.0 mass %, and the concentration of at least one dopant selected from the first dopant group is 0.10 mass % to 0.75 mass %, the formation rate of Cu—Al IMC is further improved and this is more preferable.

Note that it was confirmed that when Pt was contained singly or when only at least one or more element selected from the first dopant group was contained, the formation rate of Cu—Al IMC was insufficient, posing a problem in practical use. When the crystal structure of the balls was observed, it was confirmed that the crystal grains of the balls were relatively coarse, meaning that the grain refinement effect was not achieved sufficiently. From this, it is considered that when Pt was added singly or when only the first dopant group was added, the grain refinement effect was not achieved sufficiently, making the improvement effect on ball hardness insufficient.

Even when the bonding wire contained Pt and at least one dopant selected from the first dopant group, if the concentration of Pt was less than 0.1 mass % or if the concentration of at least one dopant selected from the first dopant group was less than 0.05 mass %, the formation rate of Cu—Al IMC was low. It is considered that this is because the concentrations of Pt and first dopant group were low, making the improvement effect on ball hardness insufficient.

Also, when more than 1.3 mass % of Pt was contained or when a total of more than 1.25 mass % of at least one or more dopant selected from the first dopant group was contained, a good formation rate of Cu—Al IMC was not available. When states of plural ball bonds were observed under an optical microscope, many of the balls were found to be bonded by being displaced from the center of the wire. It is presumed that this is because the balls were displaced from the center of the wire in the stage of ball formation. It is presumed that the reason why this phenomenon occurred is that the high concentrations of Pt and at least one or more dopant selected from the first dopant group changed the resistance and the like on the wire surface, making arc discharges unstable.

(Formation of Crimped Ball Shape into Perfect Circle and Effect of Inhibiting Cu—Al IMC Center-Unbonded During Ball Bonding)

Preferably the bonding wire of the present embodiment further contains a total of 0.0005 mass % to 0.0100 mass % of at least one or more elements selected from a second dopant group of B, P, Ca, La, and Ce. This can improve roundness of a crimped ball shape in small-ball bonding and improve the formation rate of Cu—Al IMC right under a center portion of a ball and in its vicinity in a ball bond (hereinafter referred to as the formation rate of Cu—Al IMC right under the ball), where the roundness of a crimped ball shape is required for cutting-edge narrow-pitch bonding. Specifically, in small-ball bonding using a wire with a diameter of 20 μm and balls approximately 1.4 times a wire diameter, the roundness of the crimped ball shape was improved and it was confirmed that the present embodiment is also applicable to narrow-pitch bonding with a pitch of 45 μm or less. Also, the formation rate of Cu—Al IMC right under the ball was improved, confirming that the improvement effect on the formation rate of Cu—Al IMC was able to be further enhanced. The structure of a ball section was observed, and it was confirmed that the crystal grains had been refined more finely. It is considered that with the bonding wire of the present embodiment, excessive deformation of balls and variation within the same balls were inhibited because the grain refinement effect of Pt and the first dopant group was enhanced synergistically by the addition of the second dopant group.

(Improvement Effect on Spring Performance)

Furthermore, in the bonding wire of the present embodiment, preferably a crystal orientation in a longitudinal section of the bonding wire is such that an abundance ratio of a crystal orientation <100> having an angular difference of 15 degrees or less from a longitudinal direction of the bonding wire is from 50% to 100% in terms of area percentage. This also offers the effect of inhibiting a poor loop shape called a spring failure in using a bonding method called reverse bonding. The reverse bonding is a technique for reducing the thickness of chips by limiting loop height by ball-bonding electrodes for wedge bonding and wedge-bonding electrodes for ball bonding. The spring failure is a phenomenon in which when the bonding wire is cut right above the ball after ball bonding, a great impact is delivered to the bonding wire, deforming the bonding wire into the shape of a spring and thereby causing straightness of the loop to be lost. An excellent spring failure correction effect can be obtained using the effect of improving wire strength and the effect of reducing variation of strength in the longitudinal strength of the wire. It is considered that the improvement of wire strength is attributable to the effect of improving by adding Pt, the first dopant group, and the second dopant group while the reduction of variation in the longitudinal strength of the wire is attributable to the effect of improving by crystal orientation control. For similar reasons, the addition of Pt and dopants and crystal orientation control are effective in preventing a loop shape defect called a leaning failure in which a bonded bonding wire leans toward an adjacent bonding wire before sealing.

(Improvement Effect on Wedge Bonding Strength)

Furthermore, in the bonding wire of the present embodiment, preferably breaking elongation in a tensile test is 8% to 15.5%, and more preferably 11% to 14%. In connecting high-density LSIs, because wire diameter is small, area contributing to bonding of wedge bonds is small, making it difficult to obtain bonding strength equal to that of normal bonding. To deal with this problem, good bonding strength can be obtained in wedge bonds by the combined use of the effect of increasing the bonding area by controlling the breaking elongation and the effect of making the wire resistant to breakage in spite of increased bonding area by enhancing the strength of the wire through the addition of Pt and elements of the first dopant group. Specifically, using the bonding wire of the present embodiment with a diameter of 20 μm, Ag-plated electrodes were wedge-bonded and the bonding strength was measured by a wire pull test, and as a result, it was confirmed that a good bonding strength of 4 gf or above was able to be obtained. Breaking elongation can be controlled by optimizing conditions of thermomechanical treatment and the like during manufacturing. It is considered that the bonding wire of the present embodiment has obtained excellent wedge bonding strength by combining the optimization of breaking elongation and the effect of making the wire resistant to breakage through the addition of Pt and elements of the first dopant group.

(Damage Resistance Performance of Heat-Affected Zone (Neck Portion))

Preferably, the bonding wire of the present embodiment further contains a total of 0.0005 mass % to 1.0 mass % of at least one or more elements selected from a third dopant group of Au, Pd, and Ni. In low loop connection used in connecting high-density LSIs, a wire portion right above the ball called a neck may get damaged by undergoing a large bending deformation. Also, as a characteristic of a neck portion, crystal grains become coarse under the influence of heat input during ball formation, creating a tendency for strength of the neck portion to degrade easily. Therefore, there has been demand for material design intended to inhibit strength degradation of the neck portion. The present inventors have found that by adding elements of the third dopant group in combination with Pt and elements of the first dopant group, it is possible to improve the strength of the neck portion and improve a damage prevention effect of the neck portion. Specifically, it was confirmed that damage to the neck portion was able to be reduced under loop formation conditions of 3 mm in loop length and 80 μm in loop height.

(Method for Producing Bonding Wire)

A production method of a bonding wire for a semiconductor device of the present embodiment will be described.

(Melting Method 1)

First, using high-purity Cu with copper purity of 4N to 6N (99.99 to 99.9999 mass %), a copper alloy containing necessary concentrations of dopants is prepared by melting. An arc melting furnace, high-frequency melting furnace, or the like can be used for the melting. To prevent admixture of atmospheric gases such as $O_2$ and $H_2$, preferably the melting is done in a vacuum atmosphere or in an inert atmosphere of Ar, $N_2$, or another gas. After the melting, the copper is cooled slowly in the furnace to prepare an ingot. Preferably, surfaces of the ingot produced by melting are washed with acid or alcohol, followed by drying.

(Melting Method 2)

Available alloying methods include a method of directly melting and alloying copper and high-purity additive components and a method of preparing a master alloy made up of copper and approximately 3 to 5 mass % of dopants in advance and melting and alloying copper and the master alloy. The technique which uses a master alloy is effective in making an element distribution uniform at a low concentration. With the additive components of the present embodiment, in adding Pt and elements of the first dopant group and third dopant group at a relatively high concentration of 0.5 mass % or above, a technique for directly adding high-purity additive components can be used. In adding Pt and elements of the first dopant group, second dopant group, and third dopant group stably at a low concentration, the technique which uses a master alloy is effective.

(Description of Drawing Process and Heat Treatment)

The copper alloy ingot thus produced is processed first into a large diameter by rolling and forging and then reduced in diameter by a drawing process until a final wire diameter is reached. A drawing step is carried out using a continuous wire drawing machine capable of being equipped with plural diamond-coated dies. Desirably a lubricant is used during continuous wire drawing to reduce worn-out of the dies and wire surface flaws. Because the drawing process tends to cause work hardening of the wire and increase worn-out of the dies, preferably intermediate heat treatment is carried out at an intermediate stage for the principal purpose of removing strain. Also, with the final wire diameter, final heat treatment is carried out to adjust breaking elongation by recrystallizing the bonding wire. Preferably, the intermediate heat treatment and final heat treatment are carried out while continuously running the wire. This method can reduce quality variations and provide high productivity compared to when, for example, a batch heating furnace is used. Note that desirably the heat treatment is carried out by running Ar gas or $N_2$ gas to inhibit oxidation of the bonding wire surface during the heat treatment as much as possible. Desirably the wire feed rate during the intermediate heat treatment and final heat treatment is 20 to 200 m/min to control the crystal orientation and breaking elongation.

(Method for Controlling Crystal Orientation)

Furthermore, by controlling the wire feed rate and intermediate heat treatment temperature during wire drawing, the abundance ratio of the crystal orientation <100> having an angular difference of 15 degrees or less from the longitudinal direction of the bonding wire can be adjusted. Preferred conditions are as follows: the wire feed rate during wire drawing is 400 to 600 m/min, intermediate heat treatment is carried out once at a wire diameter of 110 to 300 μm, the temperature of the intermediate heat treatment is 400 to 500° C., the temperature of the final heat treatment is 350 to 550° C., and the wire feed rate during the intermediate heat treatment and final heat treatment is 20 to 200 m/min. These conditions increase the abundance ratio of the crystal orientation <100> having an angular difference of 15 degrees or less from the longitudinal direction of the bonding wire to 50% or above.

(Method for Controlling Breaking Elongation)

Furthermore, if the wire feed rate during wire drawing is set to 470 to 770 m/min, an amount of strain on the bonding wire surface during the wire drawing process can be reduced and a recrystallized structure having equiaxial crystal grains effective in improving breaking elongation tends to be available, and consequently, the breaking elongation after the final heat treatment can be adjusted to 8 to 15%, and further to 11 to 14%.

(Method for Analyzing Types and Concentrations of Dopants Contained in Bonding Wire)

An ICP emission spectrophotometer or the like can be used for concentration analysis of elements contained in the bonding wire. If elements such as oxygen, carbon, and/or sulfur are adsorbed to the surface of the bonding wire, before conducting analysis, concentration measurements may be taken after shaving a region of 1 to 2 nm off the surface of the bonding wire by sputtering or the like. Other effective methods include a method which uses acid wash.

(Method for Measuring Crystal Orientation)

Micro area X-ray diffraction (μXRD) or electron backscattered diffraction (EBSD) can be used for measurement of the crystal orientation in a cross-sectional area of the bonding wire. Dedicated software (OIM analysis or the like produced by TSL Solutions) is suitable for analysis of EBSD measurement data. As a method for exposing a section of the bonding wire, mechanical polishing, an ion etching process, or the like can be used. The crystal orientation in the section of the bonding wire can be determined using an EBSD method. The abundance ratio of the crystal orientation <100> with an angular difference of 15 degrees or less from the longitudinal direction of the bonding wire can be found by calculating the ratio of the area occupied by the region having the crystal orientation <100> to the area of the measurement region of crystal orientations determined by EBSD or the like. The measurement region is a section which contains the wire axis and is parallel to the wire axis, measuring 100 μm or less in the longitudinal direction of the wire and extending the entire width of the wire (wire diameter).

(Method for Measuring Breaking Elongation)

A value obtained by a tensile test of the bonding wire was used as the breaking elongation.

EXAMPLES (Manufacturing Samples)

A method for manufacturing samples will be described. The Cu used as a raw material had a purity of 99.99 mass % or above, with the balance being incidental impurities. The Pt and the first to third dopant groups had a purity of 99 mass % or above, with the balance being incidental impurities. To obtain the desired wire compositions, Pt, which was a dopant, as well as alloying elements of the first dopant group, second dopant group, and third dopant group were alloyed as appropriate. When the desired concentrations of Pt and the elements of the first dopant group and third dopant group were 0.5 mass % or above, separate elements were melted and alloyed. When the desired concentrations of Pt, the first dopant group, second dopant group, and third dopant group were less than 0.5 mass %, alloys were prepared using a master alloy prepared by adding dopants in desired concentrations to copper.

The copper alloy was melted in an Ar atmosphere using a high frequency melting furnace. The ingot produced by melting had a columnar shape with a diameter of a few mm. To remove an oxide film from the surface of the resulting ingot, an acid wash process was performed using sulfuric acid, hydrochloric acid, or the like. Subsequently, the ingot was subjected to a drawing process using the dies to produce a wire with an intermediate wire diameter in a range of 0.3 to 1.4 mm. The wire feed rate during wire drawing was 10 to 770 m/min. A commercially available lubricant was used. In so doing, the reduction rate of area of the dies was 12 to 24%. Next, intermediate heat treatment was carried out once at a wire diameter of 110 to 300 μm. The temperature of the intermediate heat treatment was 200 to 600° C. After the drawing process, final heat treatment was carried out to obtain desired final breaking elongation. The intermediate heat treatment and final heat treatment were carried out at a temperature of 350 to 550° C., while continuously running the wire at a feed rate of 20 to 200 m/min. During the heat treatment, $N_2$ or Ar gas was run at a flow rate of 1 to 2 L/min to prevent oxidation. The configurations of the manufactured samples are shown in Tables 1-1, 1-2, 1-3, and 3.

(Evaluation Method)

The concentrations of the dopants contained in the wire were analyzed using an ICP spectrophotometer.

The abundance ratio of the crystal orientation <100> with an angular difference of 15 degrees or less from the longitudinal direction of the bonding wire was found by calculating the ratio of the area occupied by the region having the crystal orientation <100> to the area of the measurement region of crystal orientations determined by EBSD. The measurement region is a section which contains the wire axis and is parallel to the wire axis, measuring 100 μm or less in the longitudinal direction of the wire and extending a distance equal to the entire width of the wire (wire diameter).

(Evaluation of Formation Rate of Cu—Al IMC in Small-Ball Bonding)

After bonding of the bonding wire, heat treatment was carried out at 175° C. for 3 hours and the balls were removed by acid treatment, and the resulting samples were used in evaluating the formation rate of Cu—Al IMC in small-ball bonding. A general-purpose bonding machine and capillary were used. The electrodes to which the bonding wire was bonded were prepared by forming a film of Al-1.0 at % Si-0.5 at % Cu alloy 0.8 μm in thickness on a Si substrate. The ball size was in a range of 27.5 to 28.5 μm, which was approximately 1.4 times the wire diameter (20 μm). The balls were formed by blowing a nitrogen-hydrogen gas mixture with a hydrogen content of 4 to 5 vol %. The gas flow rate was 0.45 to 0.50 L/min. Note that any region in which Cu—Al IMC was formed was determined based on a difference in contrast from the electrode material. Cu—Al IMC, which is lower in reflectivity than the electrode material, appears dark in images taken under an optical microscope. Using this principle, the images taken under the optical microscope were binarized using image processing software and the area of Cu—Al IMC was calculated by extracting only relatively dark regions. Elemental analysis was conducted on every region using EDS (Energy dispersive spectroscope) provided on SEM (Scanning electron microscope) and it was confirmed in advance that there was no error in any of the regions. As the value of the formation rate of Cu—Al IMC, the average value of measured values of ball bonds at 100 locations selected at random was used. In the above evaluation, when the formation rate of Cu—Al IMC was less than 80%, 0 points were given by judging that there was a problem in practical use; when the formation rate was 80% inclusive to 90% exclusive, 1 point was given by judging that there was no problem in practical use; when the formation rate was 90% inclusive to 95% exclusive, 2 points were given by judging that the result was excellent; and when the formation rate was 95% inclusive to 100% exclusive, 3 points were given by judging that the result was particularly excellent. The evaluation results were entered in the "Cu—Al IMC formation rate" fields of Tables 2-1, 2-2, and 4. Only 0 points were rejected and 1 point and above were accepted.

(Evaluation of Roundness of Crimped Shape in Small-Ball Bonding)

Regarding evaluation of the crimped shapes of ball bonds in small-ball bonding, the ball bonds resulting from bonding were observed from directly above and determinations were made based on the roundness of the ball bonds. The bonding wire was bonded to an electrode manufactured by forming a 1.0-μm-thick film from an Al-0.5 at % Cu alloy on a Si substrate. The ball size was in a range of 27.5 to 28.5 μm, which was approximately 1.4 times the wire diameter (20 μm). The balls were formed by blowing a nitrogen-hydrogen gas mixture with a hydrogen content of 4 to 5 vol %. The gas flow rate was 0.45 to 0.50 L/min. Using an optical microscope, crimped ball shapes were observed at 150 locations selected at random. When the ball bond had an elliptical shape deviating greatly from a perfect circle or had an anisotropic deformation, the collapsed shape was judged to be defective. In the above evaluation, when 3 or more defects occurred, 0 points were given by judging that there was a problem in practical use; when 1 or 2 defects occurred, 1 point was given by judging that there was no problem; and when good roundness was obtained in all the ball bonds, 2 points were given by judging that the result was particularly excellent. These points were entered in the "Roundness of crimped ball shape in small-ball bonding" fields of Tables 2-1, 2-2, and 4. Only 0 points were rejected and 1 point and above were accepted.

(Evaluation of Formation Rate of Cu—Al IMC Right Under Balls in Small-Ball Bonding)

After bonding of the bonding wire, heat treatment was carried out at 175° C. for 3 hours and the balls were removed by acid treatment, and the resulting samples were used in evaluating the formation rate of Cu—Al IMC right under the balls in small-ball bonding. Cu—Al IMC forming regions were determined using a technique which involves binarizing the images taken under the optical microscope, by means of image processing software and extracting only relatively dark regions. The occurrence rate of center-unbonded was defined as the area ratio of Cu—Al IMC in a circular region with a diameter of 15 μm near the center of the ball bond. As the value of the formation rate of Cu—Al IMC right under the balls, the average value of measured values of ball bonds at 100 locations selected at random was used. When the formation rate of Cu—Al IMC right under the balls was less than 70%, 0 points were given by judging that there was a problem in practical use; when the formation rate was 70% inclusive to 95% exclusive, 1 point was given by judging that there was no problem; when the formation rate was 95% or above, 2 points were given by judging that the result was particularly excellent. These points were entered in the "Cu—Al IMC formation rate right under balls" fields of Tables 2-1, 2-2, and 4. Only 0 points were rejected and 1 point and above were accepted.

(Evaluation of Spring and Leaning)

To evaluate spring failures, 500 samples resulting from bonding were observed under an optical microscope. When there were 3 or more spring failures, i.e., spring-shaped bends on loops, 0 points were given by judging that there was a problem in practical use; when there were 1 or 2 spring failures, 1 point was given by judging that there was no problem; and when there was no spring failure, 2 points were given by judging that the result was particularly excellent. These points were entered in the "Spring performance" fields of Tables 2-1, 2-2, and 4. To evaluate leaning failures, using 500 samples resulting from bonding, deviation (amount of leaning) of each loop from the normal to the bonding surface of the ball bond was measured under an optical microscope. When the average value of the amounts of leaning was 30 μm or above, 0 points were given by judging that there was a problem in practical use; when the amount of leaning was 20 μm inclusive to 30 μm exclusive, 1 point was given by judging that there was no problem in practical use; and when the amount of leaning was less than 20 μm, 2 points were given by judging that the result was extremely excellent. These points were entered in the "Leaning performance" fields of Tables 2-1, 2-2, and 4. Only 0 points were rejected and 1 point and above were accepted.

(Evaluation of Wedge Bondability)

Electrodes obtained by Ag-plating a typical metal lead frame were wedge-bonded and the bonding strength of 10 wedge bonds selected at random was measured by a wire pull test. A lead frame made of Fe-42 at % Ni alloy was used by being Ag-plated to a thickness of 1 to 3 μm. In the present evaluation, by assuming bonding conditions more stringent than usual, stage temperature was set to 165° C., which was lower than a common set temperature zone. The average value of measurement results at 10 locations was adopted as the bonding strength of the wedge bond. In the above evaluation, when the bonding strength of the wedge bond was less than 3 gf, 0 points were given by judging that there was a problem in practical use; when the bonding strength was 3 gf or above, 1 point was given by judging that there was no problem in practical use; when the bonding strength was 3.5 gf or above, 2 points were given by judging that the result was good; and when the bonding strength was 4 gf or above, 3 points were given by judging that the result was excellent. These points were entered in the "Wedge bondability" fields of Tables 2-1, 2-2, and 4. Only 0 points were rejected and 1 point and above were accepted.

(Evaluation of Damage Resistance Performance of Neck Portion)

To evaluate the damage resistance performance of the neck portion, damage to the neck portion was observed under an SEM and a determination was made based on the occurrence frequency of the damage. In the present evaluation, as loop formation conditions for accelerated evaluation of damage to the neck portion, the loop length was set to 3 mm and the loop height was set to 80 μm. One hundred (100) neck portions selected at random were observed. When there were two or more damaged neck portions, 0 points were given by judging that there was a problem in practical use; when there was one damaged neck portion, 1 point was given by judging that there was no problem in practical use; and when there was no damaged neck portion, 2 points were given by judging that the result was excellent. These points were entered in the "Damage resistance performance of neck portion" fields of Tables 2-1, 2-2, and 4.

(Description of Evaluation Results)

Because Examples No. 1 to 81 are bonding wires containing 0.1 mass % to 1.3 mass % of Pt and a total of 0.05 mass % to 1.25 mass % of at least one dopant selected from the first dopant group consisting of In, Ga, and Ge, with the balance being made up of Cu and incidental impurities, the formation rate of Cu—Al IMC had no problem in practical use.

Because Examples No. 29 to 49, 80, and 81 are bonding wires in which the concentration of Pt is 0.3 mass % to 1.0 mass %, and a total of 0.05 mass % to 1.25 mass % of at least one dopant selected from the first dopant group is contained, or 0.1 mass % to 1.3 mass % of Pt is contained and the concentration of at least one dopant selected from the first dopant group is 0.10 mass % to 0.75 mass %, excellent formation rates of Cu—Al IMC were obtained.

Because Examples 41 to 49 are bonding wires in which the concentration of Pt is 0.3 mass % to 1.0 mass %, and the concentration of at least one dopant selected from the first dopant group is 0.10 mass % to 0.75 mass %, particularly excellent formation rates of Cu—Al IMC were obtained.

Because Examples 50 to 62, 80, and 81 are bonding wires further containing a total of 0.0005 mass % to 0.0100 mass % of at least one dopant selected from the second dopant group of B, P, Ca, La, and Ce, particularly excellent crimped shapes of ball bonds in small-ball bonding were obtained and particularly excellent formation rates of Cu—Al IMC right under balls were obtained as well.

Because Examples 63 to 67, 80, and 81 are bonding wires in which the crystal orientation in a longitudinal section of the bonding wire is such that the abundance ratio of the crystal orientation <100> having an angular difference of 15 degrees or less from the longitudinal direction of the bonding wire is from 50% to 100%, in terms of area percentage, evaluation results of spring failures and leaning failures were extremely good.

Because Examples 1 to 67, 71 to 76, 78, and 79 are bonding wires in which breaking elongation in a tensile test is 8% to 15.5%, good bonding strength of wedge bonds were obtained. Furthermore, because Examples 68 to 70, 80, and 81 are bonding wires in which breaking elongation in a tensile test is 11% to 14%, excellent bonding strength of wedge bonds were obtained.

Because Examples 72 to 81 are bonding wires further containing a total of 0.0005 mass % to 1.0 mass % of at least one element selected from a third dopant group of Au, Pd, and Ni, an excellent damage prevention effect of the neck portions was obtained.

TABLE 1-1

|  | No. | Content of Pt (mass %) | Contents of first dopant group (mass %) | | | | Contents of second dopant group (mass %) | | | | | |
| --- | --- | --- | --- | --- | --- | --- | --- | --- | --- | --- | --- | --- |
|  |  |  | In | Ga | Ge | Total | B | P | Ca | La | Ce | Total |
| Examples | 1 | 0.1 | 0.050 |  |  | 0.050 |  |  |  |  |  | 0.0000 |
|  | 2 | 0.1 |  | 0.050 |  | 0.050 |  |  |  |  |  | 0.0000 |

TABLE 1-1-continued

| No. | | | | | | | |
|---|---|---|---|---|---|---|---|
| 3 | 0.1 | | | 0.050 | 0.050 | | 0.0000 |
| 4 | 0.1 | 0.024 | 0.026 | | 0.050 | | 0.0000 |
| 5 | 0.1 | 0.020 | | 0.030 | 0.050 | | 0.0000 |
| 6 | 0.1 | | 0.028 | 0.022 | 0.050 | | 0.0000 |
| 7 | 0.1 | 0.010 | 0.020 | 0.020 | 0.050 | | 0.0000 |
| 8 | 0.1 | 1.250 | | | 1.250 | | 0.0000 |
| 9 | 0.1 | | 1.250 | | 1.250 | | 0.0000 |
| 10 | 0.1 | | | 1.250 | 1.250 | | 0.0000 |
| 11 | 0.1 | 0.500 | 0.750 | | 1.250 | | 0.0000 |
| 12 | 0.1 | 0.500 | | 0.750 | 1.250 | | 0.0000 |
| 13 | 0.1 | | 0.600 | 0.650 | 1.250 | | 0.0000 |
| 14 | 0.1 | 0.400 | 0.300 | 0.550 | 1.250 | | 0.0000 |
| 15 | 1.3 | 0.050 | | | 0.050 | | 0.0000 |
| 16 | 1.3 | | 0.050 | | 0.050 | | 0.0000 |
| 17 | 1.3 | | | 0.050 | 0.050 | | 0.0000 |
| 18 | 1.3 | 0.024 | 0.026 | | 0.050 | | 0.0000 |
| 19 | 1.3 | 0.020 | | 0.030 | 0.050 | | 0.0000 |
| 20 | 1.3 | | 0.028 | 0.022 | 0.050 | | 0.0000 |
| 21 | 1.3 | 0.010 | 0.020 | 0.020 | 0.050 | | 0.0000 |
| 22 | 1.3 | 1.250 | | | 1.250 | | 0.0000 |
| 23 | 1.3 | | 1.250 | | 1.250 | | 0.0000 |
| 24 | 1.3 | | | 1.250 | 1.250 | | 0.0000 |
| 25 | 1.3 | 0.500 | 0.750 | | 1.250 | | 0.0000 |
| 26 | 1.3 | 0.500 | | 0.750 | 1.250 | | 0.0000 |
| 27 | 1.3 | | 0.600 | 0.650 | 1.250 | | 0.0000 |
| 28 | 1.3 | 0.400 | 0.300 | 0.550 | 1.250 | | 0.0000 |

| | No. | Ratio of orientation <100> in longitudinal direction of wire in wire section | Breaking elongation | Contents of third dopant group (mass %) | | | |
|---|---|---|---|---|---|---|---|
| | | | | Au | Pd | Ni | Total |
| Examples | 1 | 41 | 10.2 | | | | 0.0000 |
| | 2 | 44 | 10.3 | | | | 0.0000 |
| | 3 | 32 | 10.1 | | | | 0.0000 |
| | 4 | 30 | 10.5 | | | | 0.0000 |
| | 5 | 25 | 10.4 | | | | 0.0000 |
| | 6 | 45 | 10.0 | | | | 0.0000 |
| | 7 | 31 | 10.9 | | | | 0.0000 |
| | 8 | 39 | 10.9 | | | | 0.0000 |
| | 9 | 42 | 10.6 | | | | 0.0000 |
| | 10 | 15 | 10.8 | | | | 0.0000 |
| | 11 | 26 | 10.7 | | | | 0.0000 |
| | 12 | 28 | 10.5 | | | | 0.0000 |
| | 13 | 16 | 10.0 | | | | 0.0000 |
| | 14 | 43 | 10.1 | | | | 0.0000 |
| | 15 | 19 | 10.1 | | | | 0.0000 |
| | 16 | 18 | 10.4 | | | | 0.0000 |
| | 17 | 22 | 10.9 | | | | 0.0000 |
| | 18 | 41 | 10.7 | | | | 0.0000 |
| | 19 | 36 | 10.3 | | | | 0.0000 |
| | 20 | 33 | 10.0 | | | | 0.0000 |
| | 21 | 38 | 10.2 | | | | 0.0000 |
| | 22 | 49 | 10.1 | | | | 0.0000 |
| | 23 | 16 | 10.6 | | | | 0.0000 |
| | 24 | 14 | 10.5 | | | | 0.0000 |
| | 25 | 30 | 10.2 | | | | 0.0000 |
| | 26 | 18 | 10.3 | | | | 0.0000 |
| | 27 | 39 | 10.2 | | | | 0.0000 |
| | 28 | 37 | 10.0 | | | | 0.0000 |

TABLE 1-2

| | No. | Content of Pt (mass %) | Contents of first dopant group (mass %) | | | | Contents of second dopant group (mass %) | | | | | |
|---|---|---|---|---|---|---|---|---|---|---|---|---|
| | | | In | Ga | Ge | Total | B | P | Ca | La | Ce | Total |
| Examples | 29 | 0.3 | 0.800 | | | 0.800 | | | | | | 0.0000 |
| | 30 | 0.3 | | 0.780 | | 0.780 | | | | | | 0.0000 |
| | 31 | 0.3 | | | 0.860 | 0.860 | | | | | | 0.0000 |
| | 32 | 1.0 | 0.840 | | | 0.840 | | | | | | 0.0000 |
| | 33 | 1.0 | | 0.800 | | 0.800 | | | | | | 0.0000 |
| | 34 | 1.0 | | | 0.790 | 0.790 | | | | | | 0.0000 |
| | 35 | 1.1 | 0.100 | | | 0.100 | | | | | | 0.0000 |

TABLE 1-2-continued

| No. | Pt (mass %) | In | Ga | Ge | Total | B | P | Ca | La | Ce | Total |
|---|---|---|---|---|---|---|---|---|---|---|---|
| 36 | 1.2 | | 0.100 | | 0.100 | | | | | | 0.0000 |
| 37 | 1.1 | | | 0.100 | 0.100 | | | | | | 0.0000 |
| 38 | 1.2 | 0.750 | | | 0.750 | | | | | | 0.0000 |
| 39 | 1.1 | | 0.750 | | 0.750 | | | | | | 0.0000 |
| 40 | 1.3 | | | 0.730 | 0.730 | | | | | | 0.0000 |
| 41 | 0.3 | 0.100 | | | 0.100 | | | | | | 0.0000 |
| 42 | 0.3 | | 0.100 | | 0.100 | | | | | | 0.0000 |
| 43 | 0.3 | | | 0.100 | 0.100 | | | | | | 0.0000 |
| 44 | 0.5 | 0.050 | 0.050 | | 0.100 | | | | | | 0.0000 |
| 45 | 0.7 | 0.500 | | | 0.500 | | | | | | 0.0000 |
| 46 | 0.8 | | 0.500 | | 0.500 | | | | | | 0.0000 |
| 47 | 1.0 | 0.750 | | | 0.750 | | | | | | 0.0000 |
| 48 | 1.0 | | 0.750 | | 0.750 | | | | | | 0.0000 |
| 49 | 1.0 | | | 0.750 | 0.750 | | | | | | 0.0000 |
| 50 | 0.1 | 0.050 | | | 0.050 | 0.0005 | | | | | 0.0005 |
| 51 | 0.1 | | 0.080 | | 0.080 | | 0.0005 | | | | 0.0005 |
| 52 | 0.1 | | | 0.090 | 0.090 | | | 0.0005 | | | 0.0005 |
| 53 | 0.1 | 0.050 | | | 0.050 | | | | 0.0005 | | 0.0005 |
| 54 | 0.1 | | 0.070 | | 0.070 | | | | | 0.0005 | 0.0005 |
| 55 | 0.1 | | | 0.040 | 0.040 | 0.0100 | | | | | 0.0100 |
| 56 | 0.1 | 0.040 | | | 0.040 | | 0.0100 | | | | 0.0100 |
| 57 | 0.1 | | 0.060 | | 0.060 | | | 0.0100 | | | 0.0100 |

| | No. | Ratio of orientation <100> in longitudinal direction of wire in wire section | Breaking elongation | Au | Pd | Ni | Total |
|---|---|---|---|---|---|---|---|
| Examples | 29 | 19 | 10.1 | | | | 0.0000 |
| | 30 | 22 | 10.5 | | | | 0.0000 |
| | 31 | 28 | 10.3 | | | | 0.0000 |
| | 32 | 19 | 10.5 | | | | 0.0000 |
| | 33 | 38 | 10.8 | | | | 0.0000 |
| | 34 | 44 | 10.1 | | | | 0.0000 |
| | 35 | 28 | 10.3 | | | | 0.0000 |
| | 36 | 27 | 10.2 | | | | 0.0000 |
| | 37 | 29 | 10.5 | | | | 0.0000 |
| | 38 | 10 | 10.4 | | | | 0.0000 |
| | 39 | 43 | 10.7 | | | | 0.0000 |
| | 40 | 41 | 10.6 | | | | 0.0000 |
| | 41 | 22 | 10.8 | | | | 0.0000 |
| | 42 | 28 | 10.0 | | | | 0.0000 |
| | 43 | 18 | 10.2 | | | | 0.0000 |
| | 44 | 13 | 10.2 | | | | 0.0000 |
| | 45 | 28 | 10.3 | | | | 0.0000 |
| | 46 | 30 | 10.4 | | | | 0.0000 |
| | 47 | 20 | 10.9 | | | | 0.0000 |
| | 48 | 15 | 10.6 | | | | 0.0000 |
| | 49 | 24 | 10.5 | | | | 0.0000 |
| | 50 | 13 | 10.8 | | | | 0.0000 |
| | 51 | 28 | 10.7 | | | | 0.0000 |
| | 52 | 26 | 10.6 | | | | 0.0000 |
| | 53 | 25 | 10.3 | | | | 0.0000 |
| | 54 | 38 | 10.4 | | | | 0.0000 |
| | 55 | 36 | 10.8 | | | | 0.0000 |
| | 56 | 19 | 10.9 | | | | 0.0000 |
| | 57 | 24 | 10.4 | | | | 0.0000 |

TABLE 1-3

| | No. | Content of Pt (mass %) | Contents of first dopant group (mass %) | | | | Contents of second dopant group (mass %) | | | | | |
|---|---|---|---|---|---|---|---|---|---|---|---|---|
| | | | In | Ga | Ge | Total | B | P | Ca | La | Ce | Total |
| Examples | 58 | 0.1 | | | 0.050 | 0.050 | | | | 0.0100 | | 0.0100 |
| | 59 | 0.1 | 0.060 | 0.010 | | 0.070 | | | | | 0.0100 | 0.0100 |
| | 60 | 0.1 | | 0.060 | | 0.060 | 0.0020 | 0.0010 | | | | 0.0030 |
| | 61 | 0.1 | | | 0.070 | 0.070 | | 0.0010 | 0.0010 | | | 0.0020 |
| | 62 | 0.1 | | 0.090 | | 0.090 | 0.0020 | | | 0.0030 | | 0.0050 |
| | 63 | 0.1 | 0.080 | | | 0.080 | | | | | | 0.0000 |
| | 64 | 0.1 | | 0.070 | | 0.070 | | | | | | 0.0000 |
| | 65 | 0.1 | | | 0.090 | 0.090 | | | | | | 0.0000 |
| | 66 | 0.1 | 0.070 | | | 0.070 | | | | | | 0.0000 |
| | 67 | 0.1 | | 0.080 | | 0.080 | | | | | | 0.0000 |

TABLE 1-3-continued

| No. | | | | | | | |
|---|---|---|---|---|---|---|---|
| 68 | 0.1 | 0.050 | | | 0.050 | | 0.0000 |
| 69 | 0.1 | | 0.050 | | 0.050 | | 0.0000 |
| 70 | 0.1 | | | 0.050 | 0.050 | | 0.0000 |
| 71 | 0.1 | | 0.050 | | 0.050 | | 0.0000 |
| 72 | 0.1 | 0.060 | | | 0.060 | | 0.0000 |
| 73 | 0.1 | | 0.080 | | 0.080 | | 0.0000 |
| 74 | 0.1 | | 0.080 | | 0.080 | | 0.0000 |
| 75 | 0.1 | | | 0.060 | 0.060 | | 0.0000 |
| 76 | 0.1 | | 0.080 | | 0.080 | | 0.0000 |
| 77 | 0.1 | 0.060 | | | 0.060 | | 0.0000 |
| 78 | 0.1 | 0.090 | | | 0.090 | | 0.0000 |
| 79 | 0.1 | | 0.080 | | 0.080 | | 0.0000 |
| 80 | 0.5 | 0.050 | | | 0.050 | 0.0015 | 0.0015 |
| 81 | 0.5 | | | 0.050 | 0.050 | 0.0018 | 0.0018 |

| | No. | Ratio of orientation <100> in longitudinal direction of wire in wire section | Breaking elongation | Contents of third dopant group (mass %) | | | |
|---|---|---|---|---|---|---|---|
| | | | | Au | Pd | Ni | Total |
| Examples | 58 | 25 | 10.3 | | | | 0.0000 |
| | 59 | 22 | 10.5 | | | | 0.0000 |
| | 60 | 19 | 10.1 | | | | 0.0000 |
| | 61 | 28 | 10.0 | | | | 0.0000 |
| | 62 | 16 | 10.3 | | | | 0.0000 |
| | 63 | 50 | 10.6 | | | | 0.0000 |
| | 64 | 59 | 10.5 | | | | 0.0000 |
| | 65 | 64 | 10.4 | | | | 0.0000 |
| | 66 | 77 | 10.7 | | | | 0.0000 |
| | 67 | 98 | 10.6 | | | | 0.0000 |
| | 68 | 45 | 11.2 | | | | 0.0000 |
| | 69 | 48 | 12.5 | | | | 0.0000 |
| | 70 | 46 | 14.0 | | | | 0.0000 |
| | 71 | 45 | 10.0 | | | | 0.0000 |
| | 72 | 40 | 8.4 | 0.0005 | | | 0.0005 |
| | 73 | 36 | 8.1 | 1.0000 | | | 1.0000 |
| | 74 | 42 | 8.0 | | 0.0005 | | 0.0005 |
| | 75 | 39 | 8.2 | | 1.0000 | | 1.0000 |
| | 76 | 34 | 8.3 | | | 0.0005 | 0.0005 |
| | 77 | 35 | 7.6 | | | 1.0000 | 1.0000 |
| | 78 | 41 | 8.2 | 0.0002 | 0.0003 | | 0.0005 |
| | 79 | 46 | 8.1 | | 0.0005 | 0.0005 | 0.0010 |
| | 80 | 75 | 13.0 | 0.4000 | | | 0.4000 |
| | 81 | 77 | 11.4 | | 0.4000 | | 0.4000 |

TABLE 2-1

| | No. | Evaluation results | | | | | | |
|---|---|---|---|---|---|---|---|---|
| | | Cu—Al IMC formation rate | Roundness of crimped ball shape in small-ball bonding | Cu—Al IMC formation rate right under balls | Spring performance | Leaning performance | Wedge bondability | Damage resistance performance of neck portion |
| Examples | 1 | 1 | 1 | 1 | 1 | 1 | 2 | 1 |
| | 2 | 1 | 1 | 1 | 1 | 1 | 2 | 1 |
| | 3 | 1 | 1 | 1 | 1 | 1 | 2 | 1 |
| | 4 | 1 | 1 | 1 | 1 | 1 | 2 | 1 |
| | 5 | 1 | 1 | 1 | 1 | 1 | 2 | 1 |
| | 6 | 1 | 1 | 1 | 1 | 1 | 2 | 1 |
| | 7 | 1 | 1 | 1 | 1 | 1 | 2 | 1 |
| | 8 | 1 | 1 | 1 | 1 | 1 | 2 | 1 |
| | 9 | 1 | 1 | 1 | 1 | 1 | 2 | 1 |
| | 10 | 1 | 1 | 1 | 1 | 1 | 2 | 1 |
| | 11 | 1 | 1 | 1 | 1 | 1 | 2 | 1 |
| | 12 | 1 | 1 | 1 | 1 | 1 | 2 | 1 |
| | 13 | 1 | 1 | 1 | 1 | 1 | 2 | 1 |
| | 14 | 1 | 1 | 1 | 1 | 1 | 2 | 1 |
| | 15 | 1 | 1 | 1 | 1 | 1 | 2 | 1 |
| | 16 | 1 | 1 | 1 | 1 | 1 | 2 | 1 |
| | 17 | 1 | 1 | 1 | 1 | 1 | 2 | 1 |
| | 18 | 1 | 1 | 1 | 1 | 1 | 2 | 1 |
| | 19 | 1 | 1 | 1 | 1 | 1 | 2 | 1 |
| | 20 | 1 | 1 | 1 | 1 | 1 | 2 | 1 |

TABLE 2-1-continued

| | No. | Cu—Al IMC formation rate | Roundness of crimped ball shape in small-ball bonding | Cu—Al IMC formation rate right under balls | Spring performance | Leaning performance | Wedge bondability | Damage resistance performance of neck portion |
|---|---|---|---|---|---|---|---|---|
| | 21 | 1 | 1 | 1 | 1 | 1 | 2 | 1 |
| | 22 | 1 | 1 | 1 | 1 | 1 | 2 | 1 |
| | 23 | 1 | 1 | 1 | 1 | 1 | 2 | 1 |
| | 24 | 1 | 1 | 1 | 1 | 1 | 2 | 1 |
| | 25 | 1 | 1 | 1 | 1 | 1 | 2 | 1 |
| | 26 | 1 | 1 | 1 | 1 | 1 | 2 | 1 |
| | 27 | 1 | 1 | 1 | 1 | 1 | 2 | 1 |
| | 28 | 1 | 1 | 1 | 1 | 1 | 2 | 1 |
| | 29 | 2 | 1 | 1 | 1 | 1 | 2 | 1 |
| | 30 | 2 | 1 | 1 | 1 | 1 | 2 | 1 |
| | 31 | 2 | 1 | 1 | 1 | 1 | 2 | 1 |
| | 32 | 2 | 1 | 1 | 1 | 1 | 2 | 1 |
| | 33 | 2 | 1 | 1 | 1 | 1 | 2 | 1 |
| | 34 | 2 | 1 | 1 | 1 | 1 | 2 | 1 |
| | 35 | 2 | 1 | 1 | 1 | 1 | 2 | 1 |
| | 36 | 2 | 1 | 1 | 1 | 1 | 2 | 1 |
| | 37 | 2 | 1 | 1 | 1 | 1 | 2 | 1 |
| | 38 | 2 | 1 | 1 | 1 | 1 | 2 | 1 |
| | 39 | 2 | 1 | 1 | 1 | 1 | 2 | 1 |
| | 40 | 2 | 1 | 1 | 1 | 1 | 2 | 1 |
| | 41 | 3 | 1 | 1 | 1 | 1 | 2 | 1 |
| | 42 | 3 | 1 | 1 | 1 | 1 | 2 | 1 |
| | 43 | 3 | 1 | 1 | 1 | 1 | 2 | 1 |
| | 44 | 3 | 1 | 1 | 1 | 1 | 2 | 1 |
| | 45 | 3 | 1 | 1 | 1 | 1 | 2 | 1 |

TABLE 2-2

| | No. | Cu—Al IMC formation rate | Roundness of crimped ball shape in small-ball bonding | Cu—Al IMC formation rate right under balls | Spring performance | Leaning performance | Wedge bondability | Damage resistance performance of neck portion |
|---|---|---|---|---|---|---|---|---|
| Examples | 46 | 3 | 1 | 1 | 1 | 1 | 2 | 1 |
| | 47 | 3 | 1 | 1 | 1 | 1 | 2 | 1 |
| | 48 | 3 | 1 | 1 | 1 | 1 | 2 | 1 |
| | 49 | 3 | 1 | 1 | 1 | 1 | 2 | 1 |
| | 50 | 1 | 2 | 2 | 1 | 1 | 2 | 1 |
| | 51 | 1 | 2 | 2 | 1 | 1 | 2 | 1 |
| | 52 | 1 | 2 | 2 | 1 | 1 | 2 | 1 |
| | 53 | 1 | 2 | 2 | 1 | 1 | 2 | 1 |
| | 54 | 1 | 2 | 2 | 1 | 1 | 2 | 1 |
| | 55 | 1 | 2 | 2 | 1 | 1 | 2 | 1 |
| | 56 | 1 | 2 | 2 | 1 | 1 | 2 | 1 |
| | 57 | 1 | 2 | 2 | 1 | 1 | 2 | 1 |
| | 58 | 1 | 2 | 2 | 1 | 1 | 2 | 1 |
| | 59 | 1 | 2 | 2 | 1 | 1 | 2 | 1 |
| | 60 | 1 | 2 | 2 | 1 | 1 | 2 | 1 |
| | 61 | 1 | 2 | 2 | 1 | 1 | 2 | 1 |
| | 62 | 1 | 2 | 2 | 1 | 1 | 2 | 1 |
| | 63 | 1 | 1 | 1 | 2 | 2 | 2 | 1 |
| | 64 | 1 | 1 | 1 | 2 | 2 | 2 | 1 |
| | 65 | 1 | 1 | 1 | 2 | 2 | 2 | 1 |
| | 66 | 1 | 1 | 1 | 2 | 2 | 2 | 1 |
| | 67 | 1 | 1 | 1 | 2 | 2 | 2 | 1 |
| | 68 | 1 | 1 | 1 | 1 | 1 | 3 | 1 |
| | 69 | 1 | 1 | 1 | 1 | 1 | 3 | 1 |
| | 70 | 1 | 1 | 1 | 1 | 1 | 3 | 1 |
| | 71 | 1 | 1 | 1 | 1 | 1 | 2 | 1 |
| | 72 | 1 | 1 | 1 | 1 | 1 | 2 | 2 |
| | 73 | 1 | 1 | 1 | 1 | 1 | 2 | 2 |
| | 74 | 1 | 1 | 1 | 1 | 1 | 2 | 2 |
| | 75 | 1 | 1 | 1 | 1 | 1 | 2 | 2 |
| | 76 | 1 | 1 | 1 | 1 | 1 | 2 | 2 |
| | 77 | 1 | 1 | 1 | 1 | 1 | 1 | 2 |
| | 78 | 1 | 1 | 1 | 1 | 1 | 2 | 2 |
| | 79 | 1 | 1 | 1 | 1 | 1 | 2 | 2 |

TABLE 2-2-continued

| | Evaluation results | | | | | | |
|---|---|---|---|---|---|---|---|
| No. | Cu—Al IMC formation rate | Roundness of crimped ball shape in small-ball bonding | Cu—Al IMC formation rate right under balls | Spring performance | Leaning performance | Wedge bondability | Damage resistance performance of neck portion |
| 80 | 2 | 2 | 2 | 2 | 2 | 3 | 2 |
| 81 | 2 | 2 | 2 | 2 | 2 | 3 | 2 |

TABLE 3

| | No. | Content of Pt (mass %) | Contents of first dopant group (mass %) | | | | Contents of second dopant group (mass %) | | | | | |
|---|---|---|---|---|---|---|---|---|---|---|---|---|
| | | | In | Ga | Ge | Total | B | P | Ca | La | Ce | Total |
| Comparative Examples | 1 | 0.20 | | | | 0.000 | | | | | | 0 |
| | 2 | 1.30 | | | | 0.000 | | | | | | 0 |
| | 3 | | 0.005 | | | 0.005 | | | | | | 0 |
| | 4 | | 1.250 | | | 1.250 | | | | | | 0 |
| | 5 | | | 0.005 | | 0.005 | | | | | | 0 |
| | 6 | | | 1.250 | | 1.250 | | | | | | 0 |
| | 7 | | | | 0.005 | 0.005 | | | | | | 0 |
| | 8 | | | | 1.250 | 1.250 | | | | | | 0 |
| | 9 | 0.08 | 0.005 | | | 0.005 | | | | | | 0 |
| | 10 | 0.08 | 1.250 | | | 1.250 | | | | | | 0 |
| | 11 | 0.08 | | 0.005 | | 0.005 | | | | | | 0 |
| | 12 | 0.08 | | 1.250 | | 1.250 | | | | | | 0 |
| | 13 | 0.08 | | | 0.005 | 0.005 | | | | | | 0 |
| | 14 | 0.08 | | | 1.250 | 1.250 | | | | | | 0 |
| | 15 | 1.30 | 0.005 | | | 0.005 | | | | | | 0 |
| | 16 | 1.41 | 1.250 | | | 1.250 | | | | | | 0 |
| | 17 | 1.30 | | 0.005 | | 0.005 | | | | | | 0 |
| | 18 | 1.43 | | 1.250 | | 1.250 | | | | | | 0 |
| | 19 | 1.30 | | | 0.005 | 0.005 | | | | | | 0 |
| | 20 | 1.31 | | | 1.250 | 1.250 | | | | | | 0 |
| | 21 | 0.50 | 0.004 | | | 0.004 | | | | | | 0 |
| | 22 | 0.50 | 1.300 | | | 1.300 | | | | | | 0 |
| | 23 | 0.50 | | 0.004 | | 0.004 | | | | | | 0 |
| | 24 | 0.50 | | 1.300 | | 1.300 | | | | | | 0 |
| | 25 | 0.50 | | | 0.004 | 0.004 | | | | | | 0 |
| | 26 | 0.50 | | | 1.300 | 1.300 | | | | | | 0 |

| | No. | Ratio of orientation <100> in longitudinal direction of wire in wire section | Breaking elongation | Contents of third dopant group (mass %) | | | |
|---|---|---|---|---|---|---|---|
| | | | | Au | Pd | Ni | Total |
| Comparative Examples | 1 | 32 | 10.2 | | | | 0.0000 |
| | 2 | 44 | 10.3 | | | | 0.0000 |
| | 3 | 43 | 10.1 | | | | 0.0000 |
| | 4 | 42 | 10.0 | | | | 0.0000 |
| | 5 | 46 | 9.7 | | | | 0.0000 |
| | 6 | 49 | 9.6 | | | | 0.0000 |
| | 7 | 44 | 10.4 | | | | 0.0000 |
| | 8 | 45 | 10.6 | | | | 0.0000 |
| | 9 | 41 | 9.6 | | | | 0.0000 |
| | 10 | 38 | 10.4 | | | | 0.0000 |
| | 11 | 46 | 10.8 | | | | 0.0000 |
| | 12 | 38 | 9.4 | | | | 0.0000 |
| | 13 | 46 | 10.6 | | | | 0.0000 |
| | 14 | 42 | 9.7 | | | | 0.0000 |
| | 15 | 41 | 10.9 | | | | 0.0000 |
| | 16 | 40 | 9.4 | | | | 0.0000 |
| | 17 | 45 | 9.2 | | | | 0.0000 |
| | 18 | 43 | 10.4 | | | | 0.0000 |
| | 19 | 39 | 10.1 | | | | 0.0000 |
| | 20 | 34 | 10.0 | | | | 0.0000 |
| | 21 | 49 | 9.7 | | | | 0.0000 |
| | 22 | 38 | 9.3 | | | | 0.0000 |
| | 23 | 44 | 10.6 | | | | 0.0000 |

TABLE 3-continued

| | | | |
|---|---|---|---|
| 24 | 46 | 10.1 | 0.0000 |
| 25 | 49 | 9.4 | 0.0000 |
| 26 | 44 | 9.5 | 0.0000 |

TABLE 4

| | No. | Evaluation results | | | | | | |
|---|---|---|---|---|---|---|---|---|
| | | Cu—Al IMC formation rate | Roundness of crimped ball shape in small-ball bonding | Cu—Al IMC formation rate right under balls | Spring performance | Leaning performance | Wedge bondability | Damage resistance performance of neck portion |
| Comparative Examples | 1 | 0 | 1 | 1 | 1 | 1 | 1 | 1 |
| | 2 | 0 | 1 | 1 | 1 | 1 | 1 | 1 |
| | 3 | 0 | 1 | 1 | 1 | 1 | 1 | 1 |
| | 4 | 0 | 1 | 1 | 1 | 1 | 1 | 1 |
| | 5 | 0 | 1 | 1 | 1 | 1 | 1 | 1 |
| | 6 | 0 | 1 | 1 | 1 | 1 | 1 | 1 |
| | 7 | 0 | 1 | 1 | 1 | 1 | 1 | 1 |
| | 8 | 0 | 1 | 1 | 1 | 1 | 1 | 1 |
| | 9 | 0 | 1 | 1 | 1 | 1 | 1 | 1 |
| | 10 | 0 | 1 | 1 | 1 | 1 | 1 | 1 |
| | 11 | 0 | 1 | 1 | 1 | 1 | 1 | 1 |
| | 12 | 0 | 1 | 1 | 1 | 1 | 1 | 1 |
| | 13 | 0 | 1 | 1 | 1 | 1 | 1 | 1 |
| | 14 | 0 | 1 | 1 | 1 | 1 | 1 | 1 |
| | 15 | 0 | 1 | 1 | 1 | 1 | 1 | 1 |
| | 16 | 0 | 1 | 1 | 1 | 1 | 1 | 1 |
| | 17 | 0 | 1 | 1 | 1 | 1 | 1 | 1 |
| | 18 | 0 | 1 | 1 | 1 | 1 | 1 | 1 |
| | 19 | 0 | 1 | 1 | 1 | 1 | 1 | 1 |
| | 20 | 0 | 1 | 1 | 1 | 1 | 1 | 1 |
| | 21 | 0 | 1 | 1 | 1 | 1 | 1 | 1 |
| | 22 | 0 | 1 | 1 | 1 | 1 | 1 | 1 |
| | 23 | 0 | 1 | 1 | 1 | 1 | 1 | 1 |
| | 24 | 0 | 1 | 1 | 1 | 1 | 1 | 1 |
| | 25 | 0 | 1 | 1 | 1 | 1 | 1 | 1 |
| | 26 | 0 | 1 | 1 | 1 | 1 | 1 | 1 |

The invention claimed is:

1. A bonding wire for a semiconductor device containing Pt of 0.1 mass % to 1.3 mass %, at least one dopant selected from a first dopant group consisting of In, Ga, and Ge, for a total of 0.05 mass % to 1.25 mass %, and a balance being made up of Cu and incidental impurities, wherein breaking elongation in a tensile test of the bonding wire is 8% to 15.5%, and the bonding wire has no coating layer.

2. The bonding wire for a semiconductor device according to claim 1, further containing at least one dopant selected from a second dopant group of B, P, Ca, La, and Ce, for a total of 0.0005 mass % to 0.0100 mass %.

3. The bonding wire for a semiconductor device according to claim 1, wherein a crystal orientation in a longitudinal section of the bonding wire is such that an abundance ratio of a crystal orientation <100> having an angular difference of 15 degrees or less from a longitudinal direction of the bonding wire is from 50% to 100% in area percentage.

4. The bonding wire for a semiconductor device according to claim 1, further containing at least one element selected from a third dopant group of Au, Pd, and Ni, for a total of 0.0005 mass % to 1.0 mass %.

* * * * *